US006455230B1

(12) United States Patent
Damme et al.

(10) Patent No.: US 6,455,230 B1
(45) Date of Patent: Sep. 24, 2002

(54) METHOD FOR PREPARING A LITHOGRAPHIC PRINTING PLATE BY ABLATION OF A HEAT SENSITIVE ABLATABLE IMAGING ELEMENT

(75) Inventors: Marc Van Damme, Mechelen; Peter Hendrikx, Hamont-Achel, both of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/577,484

(22) Filed: May 25, 2000

Related U.S. Application Data

(60) Provisional application No. 60/140,980, filed on Jun. 29, 1999.

(30) Foreign Application Priority Data

Jun. 4, 1999 (EP) ........................................... 99201791

(51) Int. Cl.$^7$ ................................................ G03F 7/004

(52) U.S. Cl. ....................... 430/302; 430/303; 430/348; 430/944; 430/945; 430/964; 101/463.1; 101/465

(58) Field of Search ................................ 430/170, 171, 430/270.1, 281.1, 302, 303, 944, 945, 348, 964; 101/463.1, 465

(56) References Cited

U.S. PATENT DOCUMENTS

| | | | | | |
|---|---|---|---|---|---|
| 5,814,431 | A | * | 9/1998 | Nagasaka et al. | 430/281.1 |
| 5,922,512 | A | * | 7/1999 | DoMinh | 430/302 |
| 5,985,514 | A | * | 11/1999 | Zheng et al. | 430/270.1 |
| 6,096,471 | A | * | 8/2000 | Van Damme et al. | 430/188 |
| 6,096,479 | A | * | 8/2000 | Kawamura et al. | 430/270.1 |
| 6,136,503 | A | * | 10/2000 | Zheng et al. | 430/270.1 |
| 6,146,812 | A | * | 11/2000 | Leon et al. | 430/270.1 |
| 6,159,657 | A | * | 12/2000 | Fleming et al. | 430/270.1 |
| 6,162,578 | A | * | 12/2000 | Zheng et al. | 430/270.1 |
| 6,165,679 | A | * | 12/2000 | Van Damme et al. | 430/270.1 |
| 6,165,691 | A | * | 12/2000 | Damme et al. | 430/303 |
| 6,190,830 | B1 | * | 2/2001 | Leon et al. | 430/270.1 |
| 6,190,831 | B1 | * | 2/2001 | Leon et al. | 430/270.1 |
| 6,242,155 | B1 | * | 6/2001 | Yamasaki et al. | 430/270.1 |

FOREIGN PATENT DOCUMENTS

| | | | | |
|---|---|---|---|---|
| EP | 288 076 | A2 | * | 10/1988 |
| EP | 652 483 | A1 | * | 5/1995 |
| EP | 784 233 | A1 | * | 7/1997 |
| EP | 0 819 986 | A1 | | 1/1998 |
| EP | 0 890 879 | A2 | | 1/1999 |
| EP | 0 911 153 | A1 | | 4/1999 |
| EP | 0 890 879 | A3 | | 9/1999 |
| EP | 938 972 | A1 | * | 9/1999 |

* cited by examiner

*Primary Examiner*—Janet Baxter
*Assistant Examiner*—Barbara Gilmore
(74) *Attorney, Agent, or Firm*—Breiner & Breiner, L.L.C.

(57) ABSTRACT

According to the present invention there is provided a method for preparing a lithographic printing plate, the method including the steps of (1) providing an imaging element including on a lithographic hydrophilic support as contiguous top layer a heat-sensitive coating including a compound capable of converting light to heat and a compound, which becomes more hydrophilic under the action of heat;

(2) imagewise exposing the imaging heat-sensitive composition with a high intensity laser emitting a laser beam with an intensity at the surface of the heat-sensitive composition of tat least 2 mW/$\mu$m$^2$ thereby at least partially removing the heat-sensitive composition to expose at least partially the lithographic support.

9 Claims, No Drawings

METHOD FOR PREPARING A LITHOGRAPHIC PRINTING PLATE BY ABLATION OF A HEAT SENSITIVE ABLATABLE IMAGING ELEMENT

This appln claims benefit of Provisional No. 60/140,980 filed Jun. 29, 1999.

FIELD OF THE INVENTION

The present invention relates to a heat sensitive ablatable imaging element.

More specifically the invention is related to a heat sensitive ablatable imaging element for preparing a lithographic printing plate, which requires no dissolution processing.

BACKGROUND OF THE INVENTION

Lithography is the process of printing from specially prepared surfaces, some areas of which are capable of accepting lithographic ink, whereas other areas, when moistened with water, will not accept the ink. The areas which accept ink define the printing image areas and the ink-rejecting areas define the background areas.

In the art of photolithography, a photographic material is made imagewise receptive to oily or greasy inks in the photo-exposed (negative working) or in the non-exposed areas (positive working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above-described photographic materials from which the printing plates are made are exposed in contact through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the above mentioned photosensitive coatings are not sensitive enough to be directly exposed to a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A- 60- 61 752 but has the disadvantage that a complex development and associated developing liquids are needed.

GB- 1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower dot crispness. The trend towards heat mode printing plate precursors is clearly seen on the market.

EP-A- 444 786, JP- 63-208036, and JP- 63-274592 disclose photopolymer resists that are sensitized to the near IR. So far, none has proved commercially viable and all require wet development to wash off the unexposed regions. EP-A- 514 145 describes a laser addressed plate in which heat generated by the laser exposure causes particles in the plate coating to melt and coalescence and hence change their solubility characteristics. Once again, wet development is required.

U.S. Pat. No. 5,605,780 discloses a lithographic printing plate comprising an anodized aluminum support and an image-forming layer overlying said support; said image-forming layer comprising an IR absorbing agent dispersed in a film-forming polymeric binder; said film-forming polymeric binder being a cyanoacrylate polymer and said IR-absorbing agent being dispersed therein in an amount sufficient for said image-forming layer to be imaged by laser-induced thermal ablation which completely removes said image forming layer in exposed regions thereof to thereby reveal said underlying support. This method has the disadvantage that in said way it is very difficult to generate a fog-free aluminum support. Plates made by ablation can not be printed without scumming.

EP-A- 652 483 discloses a lithographic printing plate requiring no dissolution processing which comprises a substrate bearing a heat-sensitive coating comprising a photothermal converter, which coating becomes relatively more hydrophilic under the action of heat. This principle has as disadvantage that the lithographic latitude is very narrow whereby pretty fast toning occurs at the exposed areas.

OBJECTS OF THE INVENTION

It is an object of the invention to provide an ablative imaging element for preparing a lithographic printing plate requiring no dissolution processing which is positive working.

It is also an object of the invention to provide an ablative imaging element for preparing a lithographic printing plate requiring no dissolution processing which shows a good ink-uptake in the exposed areas and no toning in the non-exposed areas.

SUMMARY OF THE INVENTION

According to the present invention there is provided a method for preparing a lithographic printing plate, said method comprising the steps of (1) providing an imaging element comprising on a lithographic hydrophilic support as contiguous top layer a heat-sensitive coating comprising a compound capable of converting light to heat and a compound, which becomes more hydrophilic under the action of heat;

(2) imagewise exposing said imaging heat-sensitive composition with a high intensity laser emitting a laser beam with an intensity at the surface of said heat-sensitive composition of at least 2 mW/$\mu m^2$ thereby at least partially removing said heat-sensitive composition to expose at least partially the lithographic support.

DETAILED DESCRIPTION OF THE INVENTION

The top layer, being the heat-sensitive or image-forming layer which becomes more hydrophilic under the influence of heat comprises a switchable binder and a compound capable of transferring light into heat. A switchable binder is a polymer or copolymer which under-the influence of heat and/or acid undergoes a polarity transfer from hydrophilic to hydrophobic or vice versa. According to the present invention a switchable binder is used which becomes more hydrophilic by heating and/or under the influence of acid. By “more hydrophilic” is meant an increase in the wettability of the coating by aqueous solutions of substantially neutral pH (i. e. in the pH range of 4 to 10), the coating retaining its structural integrity. Increased wettability is evidenced by a decrease in the contact angle formed between the coating and the aqueous solution. This surface polarity difference is sufficient to prepare a classical offset printing plate. However, the lithographic latitude is restricted.

Preferably the switchable binders according to the invention are polymers or copolymers which contain pendant polar functions, capable of reacting under the action of heat and/or acid to form more polar, hydrophilic groups. Examples of groups which behave in this way include t-alkylcarboxylates, e.g. t-butylesters, as disclosed in EP-A-249139, t-alkyl carbonates e.g. t-butyl carbonates, as disclosed in polymer bulletin, 17, 1–6 (1987), benzyl carboxylates e.g. nitrobenzyl or cyanobenzyl esters as disclosed in U.S. Pat. No. 4,963,463, and dimethyl benzyl esters as disclosed in Polym. Mat. Sci. Eng. 1989, 60, 142, and alkoxyalkyl esters, as disclosed in WO 92/09934. The latter are preferred, and may be represented by the formula (I)

(I)

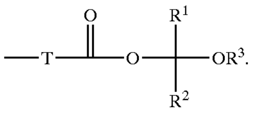

in which:

one of R1 or R2 is hydrogen and the other is hydrogen or an alkyl group up to 18 carbon atoms, $R^3$ represents an alkyl group up to 18 carbon atoms; or any two of $R^1$, R2 and R3 may together form a carbocyclic or heterocyclic ring, and T represents a divalent linking group bonded to a polymer backbone Further details regarding suitable identities for T and the polymer backbone are disclosed in WO 92/09934.

Preferably, $R^1$ is hydrogen and $R^2$ and $R^3$ together complete a 5- or 6-membered ring.

Preferably the polymer is derived from tetrahydropyranyl methacrylate (THPM) and has repeat units of formula (II)

(II)

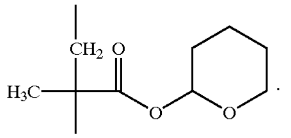

The cyclic acetal ester groups in the units of formula (II) are relatively hydrophobic and are stable at ambient temperatures under neutral or alkaline conditions. At elevated temperatures, a cleavage reaction is believed to take place, generating the corresponding carboxylic acid which is polar and hydrophylic.

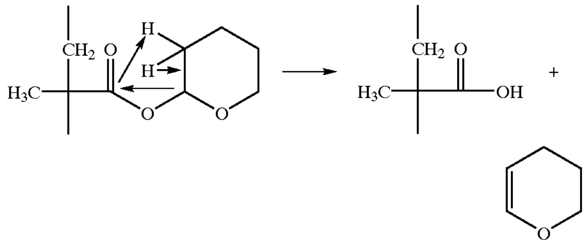

The process is greatly enhanced by the presence of acid, and enables the production of a lithographic printing surface without the need of dissolution development, since image-wise generation of heat and/or acid within the coating of a relevant polymer produces a corresponding pattern of hydrophilic (ink-repellent) and hydrophobic (ink-accepting) areas on the imaging element.

The properties of the reactive polymer may be enhanced by blending with other polymers, as disclosed in WO 92/09934. Polymers and copolymers of maleic anhydride are particularly suitable for this purpose, and may comprise up to 90 wt % of the coating, but preferably not more than 50 wt %. the resulting blends show improved durability and enhanced differential in wettability.

The reactive polymer may comprise repeating units derived from one or more comonomers that do not contain heat-sensitive groups. For example, THPM (or a similar monomer) may be copolymerized with any of the conventional acrylate or methacrylate or other vinyl monomers to produce polymers with varying physical properties, provided said comonomer do not contain strongly acidic groups (such as carboxylic acid, sulphonic acid etc.) which may cause unwanted cleavage of the reactive groups. Preferred comonomers include vinyl-functional trialkoxysilanes, such as methacryloyloxypropyltrimethoxysilane (MPTS), in quantities of up to 50 mol % of the reactive polymer. The preferred copolymer comprises 90 mol % THPM and 10 mol % MPTS.

The image forming layer may comprise more than one switchable polymer although that is not preferred.

The image-forming layer includes a compound capable of converting light into heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared absorbing dyes and pigments and in particular infrared absorbing pigments. Examples of infrared absorbing dyes are disclosed in EP-A- 97 203 131.4. Examples of infrared absorbing pigments are carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. Said compound capable of converting light into heat is preferably present in the top layer but can also be included in an underlying layer.

Said compound capable of converting light into heat is present in the imaging element preferably in an amount between 1 and 25% by weight of the total weight of the image forming layer, more preferably in an amount between 2 and 20% by weight of the total weight of the image forming layer. The compound capable of converting light into heat is most preferably present in the imaging element in an amount to provide an optical density at a wavelenght between 800 nm and 1100 nm of at least 0.35.

Optionally, the image-forming layer comprises a thermal acid. The term "thermal acid" relates to a non-acid compound, which release an acid by heating.

Ionic thermal acids are suitable for use in this invention. Examples of these include onium salts, in particular iodonium, sulfonium, phosphonium, selenonium, diazonium and arsonium salts.

Useful ionic thermal acids include those represented by the formula:

$$X^+R^1R^2R^3R^4\ W^-$$

When X is iodine then $R^3$ and $R^4$ are electron lone pairs and $R^1$ and $R^2$ each independently are aryl or substituted aryl groups. When X is S or Se then $R^4$ is an electron lone pair and $R^1$, $R^2$ and $R^3$ each independently can be an aryl group, a substituted aryl group, an aliphatic group or a substituted aliphatic group. When X is P or As, then $R^1$, $R^2$, $R^3$ and $R^4$ each independently can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pKa is less than three.

Any of the onium salts described in U.S. Pat. No. 4,708,925 can be utilized as the thermal acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as a thermal acid is particularly preferred in this invention.

Specific examples of particularly useful onium salts include diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic thermal acids are also suitable for use in this invention. Examples of these include compounds of the formula $$RCH_2X,\ RCHX_2,\ RCX_3,\ R(CH_2X)_2 \text{ and } R(CH_2X)_3$$

wherein X is Cl, Br, F, or $CF_3SO_3$ and R is an aromatic group or an aliphatic group.

Further suitable non-ionic thermal acids are haloalkyl-substituted s-triazines as disclosed in EP-A- 672 954, o-quinone diazides, photo acid generating agents having an o-nitrobenzyl type protective group as described in Polymer Sci., by S. Hayase et al, 25, 573 (1987); the compounds which are subjected to a photodecomposition to generate a sulfonic acid, represented by iminosulfonates as described in Polymer Preprints Japan, by M. Tunooka et al, 35 (8), by disulfon compounds described in JP-Pi 61-166544, by a-sulphonyloxy ketones, by a-hydroxymethylbenzoine sulphonates, by nitrobenzyl sulphonates, by a-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in Tetrahedron Letters, by M. Rubinstein et al., 17, 1445 (1975), by benzoine phosphates or phosphonates, as described in J. Org. Chem. by M. Pirrung and S. Shuey, 59 , 3890 (1994), by pyrenemethylphosphates or phosphonates, by iminophosphates or phosphonates and by imidophosphates or phosphonates, the preparation of these last compounds being well known in the literature.

Further, compounds in which the above thermal acids are introduced into a primary chain or a side chain of a polymer can be used. Examples thereof include the compounds described in e.g. J.Am.Chem.Soc., by M. E. Woodhouse et al, 104, 5586 (1982); J.Imaging Sci., by S. P. Pappas et al, 30 (5), 218 (1986); etc.

Furthermore this IR-sensitive layer is preferably a visible light- and UV-light desensitized layer. This preferably visible light- or UV-light desensitized layer does not comprise photosensitive ingredients such as diazo compounds, photoacids, photoinitiators, quinone diazides, sensitisers etc. which absorb in the wavelength range of 250 nm to 650 nm. In this way a daylight stable printing plate can be obtained.

The image-forming layer is preferably applied in an amount between 0.1 and 10 $g/m^2$, more preferably in an amount between 0.5 and 5 $g/m^2$.

The hydrophilic lithographic support may be as well a rigid as a flexible support In the imaging element according to the present invention, the support can be an anodized aluminum. A particularly preferred support is an electrochemically grained and anodized aluminum support According to another embodiment in connection with the present invention, said hydrophilic lithographic base can be a hardened hydrophilic layer, containing a hydrophilic binder and a hardening agent coated on a flexible support.

Such hydrophilic binders are disclosed in e.g. EP-A- 450 199, which therefor is incorporated herein by reference. Preferred hardened hydrophilic layers comprise partially modified dextrans or pullulan hardened with an aldehyde as disclosed in e.g. EP-A- 514 990 which therefor is incorporated herein by reference. More preferred hydrophilic layers are, layers of polyvinyl alcohol hardened with a tetraalkyl orthosilicate and preferably containing SiO2 and/or $TiO_2$ wherein the weight ratio between said polyvinylalcohol and said tetraalkyl orthosilicate is between 0.5 and 5 as disclosed in e.g. GB-P- 1 419 512, FR-P- 2 300 354, U.S. Pat. No. 3,971,660, U.S. Pat. No. 4,284,705, EP-A- 405 016 and EP-A- 450 199 which therefor are incorporated herein by reference.

Flexible supports may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide.

The imaging element can be prepared by applying the different layers according to any known technique. Alternatively said imaging element may be prepared on the press with the support already on the press by a coater placed in the immediate vicinity of the press.

Imaging in connection with the present invention can be done by an image-wise scanning exposure involving the use of a laser or a LED, more preferably of a laser or a LED that operates in the infrared or near-infrared, i.e. wavelength range of 700–1500 nm. Most preferred are laser diodes emitting in the near infrared. Exposure of the imaging element can be performed with lasers with a short as well as with lasers with a long pixel dwell time. Preferred are lasers with a pixel dwell time between 0.005 μs and 20 μs.

The intensity of the laser or LED at the surface of said heat-sensitive composition is at least 2 mW/μm$^2$, more preferably at least 4 mW/μm$^2$ in order to ablate at the exposed areas the heat sensitive composition that is not ablated, has become hydrophilic so that said residue is not detrimental to the hydrophilicity of the exposed areas and does not sause scum.

After the exposure the imaging element is ready to be used as a lithographic printing plate.

In another embodiment of the invention the exposure of the imaging element can be carried out with the imaging element already on the press. A computer or other information source supplies graphics and textual information to a laser or a LED via a lead.

The printing plate of the present invention can also be used in the printing process as a seamless sleeve printing plate. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

The following examples illustrate the present invention without limiting it thereto. All parts and percentages are by weight unless otherwise specified.

EXAMPLES 1

An imaging element I was prepared by coating a 180 μm thick aluminum sheet, having a grained and anodized surface, with a solution of a switchable copolymer (tetrahydropyranyl methacrylate/methacryloxypropyl-trimethoxysilane) in a monomer ratio of 90/10 by mol (0.35 g), and an IR-absorbing dye IR-1 (0.0365 g) in methyl ethyl ketone resulting in a themosensitive layer with a dry layer thickness of 1.8 g/m$^2$. The optical density was 0.49. As a reference imaging element II was prepared with a heat-sensitive layer as imaging element I except that the switchable polymer was replaced by a novolac binder Alnovol SPN452™, sold by Clariant, Germany. The optical density was 0.25.

The plates were exposed on an ISOMET testbed equiped with a diode laser (830 nm) having a laser spot of 11×11 μm$^2$ at the 1/e$^2$ point. The plates were exposed at different image plane power settings at a drum speed of 3.2 m/s. The optical densities of the exposed areas were measured (Macbeth RD 918 SB™—blue filter) to quantify the material removed by IR-exposure. The results are summarized in table 1.

After imaging the plates were printed on an ABDick $_{360}$™ press with K+E 800™ ink and water+5% G648™ (silica containing fountain, solution from Agfa-Gevaert) as fountain solution. In table 1, the maximum number of sheets which could be printed without toning is reported.

TABLE 1

| | Density | | | Maximum number | | |
|---|---|---|---|---|---|---|
| | 62 mW | 120 mW | 240 mW | 62 mW | 120 mW | 240 mW |
| Element I | 0.40 | 0.29 | 0.13 | 400 | 500 | >7000 |
| Element II | 0.23 | 0.17 | 0.12 | 0 | 0 | 0 |

From these results it is clear that ablation of an IR-sensitive layer that does not contain a heat switchable polymer, does not yield a useful printing plate (maximum number of prints is 0). A non-ablative exposure of a heat switchable IR-sensitive layer leads to a printing plate with a limited lithographic latitude (maximum number of prints is 400). An ablative exposure of a heat switchable IR-sensitive layer leads to a printing plate with an improved acceptable lithographic latitude (maximum number of prints is more than 7000).

The ablative exposure takes place at a power setting >=240 mW at 3.2 m/s for a laser spot of 11×11 μm$^2$ at the 1/e$^2$ point. This corresponds to an intensity of 240 mW/(11×11) μm$^2$=2mW/μm$^2$.

What is claimed is:

1. A method for preparing a lithographic printing plate, said method comprising the steps of (1) providing an ablative imaging element comprising on a lithographic hydrophilic support a contiguous top layer of a heat-sensitive coating comprising a compound capable of converting light to heat and a hinder which becomes more hydrophilic under the action of heat;

(2) imagewise exposing said imaging heat-sensitive composition with a high intensity laser emitting a laser beam with an intensity at the surface of said heat-sensitive composition of at least 2 mW/μm$^2$ thereby at least partially removing said heat-sensitive composition to expose at least partially the lithographic support.

2. A method for preparing a lithographic printing plate according to claim 1, wherein said intensity is at least 4 mW/μm$^2$.

3. A method for preparing a lithographic plate according to claim 1, wherein the binder is a polymer having pendant hydrophobic groups that react under the action of heat and/or acid to form hydrophilic groups.

4. A method for preparing a lithographic plate according to claim 3 wherein said pendant hydrophobic groups are selected from t-alkyl carboxylates, t-alkyl carbonates, benzyl carboxylates and alkoxyalkyl esters.

5. A method for preparing a lithographic plate according to claim 3 wherein said pendant hydrophobic groups have the following formula(I)

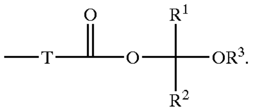

(I)

in which:

one of R1 and R2 is hydrogen and the other is hydrogen or an alkyl group with up to 18 carbon atoms, $R^3$ represents an alkyl group of up to 18 carbon atoms; or any two of $R^1$, R2 and R3 may together form a carbocyclic or heterocyclic ring, and T represents a divalent linking group bonded to a polymer backbone.

6. A method for preparing a lithographic plate according to claim 5 wherein $R^1$ is hydrogen and $R^2$ and $R^3$ together complete a 5- or 6-membered ring.

7. A method for preparing a lithographic plate according to claim 3 wherein the polymer having pendant hydrophobic groups that react under the action of heat and/or acid to form hydrophilic groups comprises repeating units derived from one or more comonomers that do not contain heat-sensitive groups.

8. A method for preparing a lithographic plate according to claim 7 wherein said polymer having pendant hydrophobic groups that react under the action of heat and/or acid to form hydrophilic groups is a copolymer of tetrahydropyranylmethacrylate (THPM) and methacryloxypropyltrimethoxysilane (MPTS).

9. A method for preparing a lithographic plate according to claim 1 wherein the heat-sensitive coating comprises a thermal acid.

* * * * *

UNITED STATES PATENT AND TRADEMARK OFFICE

CERTIFICATE OF CORRECTION

PATENT NO. : 6,455,230 B1 Page 1 of 1
DATED : September 24, 2002
INVENTOR(S) : Marc Van Damme et al.

It is certified that error appears in the above-identified patent and that said Letters Patent is hereby corrected as shown below:

Title page,
Item [12], "Damme et al." should read -- Van Damme et al. --.
Item [57], ABSTRACT,
Line 12, "tat least" should read -- at least --.

Column 3,
Line 53, Formula (I), "$OR^3$." should read -- $OR^3$ --.

Column 6,
Line 57, "are, layers" should read -- are layers --.

Column 7,
Line 25, after "composition" insert -- . The residue of the heat-sensitive composition --.
Line 28, delete "sause" and insert -- cause --.

Column 8,
Line 1, "$_{360}{}^{TM}$" should read -- $360^{TM}$ --.
Line 3, "fountain," should read -- fountain --.
Line 43, "hinder" should read -- binder --.

Column 9,
Line 4, Formula (I), "$OR^3$." should read -- $OR^3$ --.

Signed and Sealed this

Twenty-eighth Day of January, 2003

JAMES E. ROGAN
*Director of the United States Patent and Trademark Office*